(12) United States Patent
Oshima

(10) Patent No.: US 12,362,727 B2
(45) Date of Patent: Jul. 15, 2025

(54) COMPOSITE FILTER DEVICE

(71) Applicant: Murata Manufacturing Co., Ltd., Nagaokakyo (JP)

(72) Inventor: Naoki Oshima, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 203 days.

(21) Appl. No.: 18/237,020

(22) Filed: Aug. 23, 2023

(65) Prior Publication Data

US 2024/0072767 A1 Feb. 29, 2024

(30) Foreign Application Priority Data

Aug. 24, 2022 (JP) ................. 2022-133444

(51) Int. Cl.
*H03H 9/64* (2006.01)
*H03H 3/02* (2006.01)
(52) U.S. Cl.
CPC ............ *H03H 9/6489* (2013.01); *H03H 3/02* (2013.01); *H03H 2003/022* (2013.01)
(58) Field of Classification Search
CPC .................................................. H03H 9/6489
See application file for complete search history.

(56) References Cited

U.S. PATENT DOCUMENTS

| 2016/0173062 A1* | 6/2016 | Takamine | ............ H03H 9/6433 |
| | | | 333/133 |
| 2017/0099043 A1* | 4/2017 | Goto | ...................... H03H 9/725 |
| 2019/0058452 A1* | 2/2019 | Takata | ............... H03H 9/02818 |

FOREIGN PATENT DOCUMENTS

JP 2015-070489 A 4/2015

* cited by examiner

*Primary Examiner* — Samuel S Outten
(74) *Attorney, Agent, or Firm* — Keating & Bennett, LLP

(57) ABSTRACT

A composite filter device includes a piezoelectric substrate, a transmission filter, a reception filter, a first capacitance element, and a second capacitance element. The transmission filter includes a first parallel arm resonator connected to a first reference potential electrode. The reception filter includes a second parallel arm resonator connected to a second reference potential electrode. The first capacitance element is connected between a signal line in the reception filter and the first reference potential electrode. The second capacitance element is connected to the signal line and the second reference potential electrode in the reception filter.

20 Claims, 16 Drawing Sheets

COMPOSITE FILTER DEVICE

CROSS REFERENCE TO RELATED APPLICATIONS

This application claims the benefit of priority to Japanese Patent Application No. 2022-133444 filed on Aug. 24, 2022. The entire contents of this application are hereby incorporated herein by reference.

BACKGROUND OF THE INVENTION

1. Field of the Invention

The present disclosure relates to a composite filter device.

2. Description of the Related Art

A composite filter device is known. One example of a composite filter device is disclosed in Japanese Unexamined Patent Application Publication No. 2015-070489.

The composite filter device described in Japanese Unexamined Patent Application Publication No. 2015-070489 includes a high-pass filter and a low-pass filter, which are formed on a common piezoelectric substrate. Each of the high-pass filter and the low-pass filter is configured as a ladder filter. One end of a parallel arm of the high-pass filter is connected to a ground potential via a first conductive material. One end of a parallel arm of the low-pass filter is connected to the ground potential via a second conductive material that is arranged separately from the first conductive material.

SUMMARY OF THE INVENTION

Preferred embodiments of the present invention provide composite filter devices each with improved attenuation characteristics and isolation characteristics while preventing bandpass characteristics from deteriorating.

A composite filter device according to a preferred embodiment of the present invention includes a piezoelectric substrate including a first reference potential electrode and a second reference potential electrode, a first acoustic wave filter having a first pass band, a second acoustic wave filter having a second pass band higher than the first pass band, a first capacitance element including a first end connected to the first reference potential electrode, and a second capacitance element including a first end connected to the second reference potential electrode. The first acoustic wave filter includes a first parallel arm resonator on the piezoelectric substrate and connected to the first reference potential electrode, and the second acoustic wave filter includes a second parallel arm resonator on the piezoelectric substrate and connected to the second reference potential electrode, and a plurality of series arm resonators. A second end of the first capacitance element is connected to a signal line connecting the plurality of series arm resonators, and a second end of the second capacitance element is connected to the signal line connecting the plurality of series arm resonators.

Preferred embodiments of the present invention provide composite filter devices each with improved attenuation characteristics and isolation characteristics while preventing bandpass characteristics from deteriorating.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
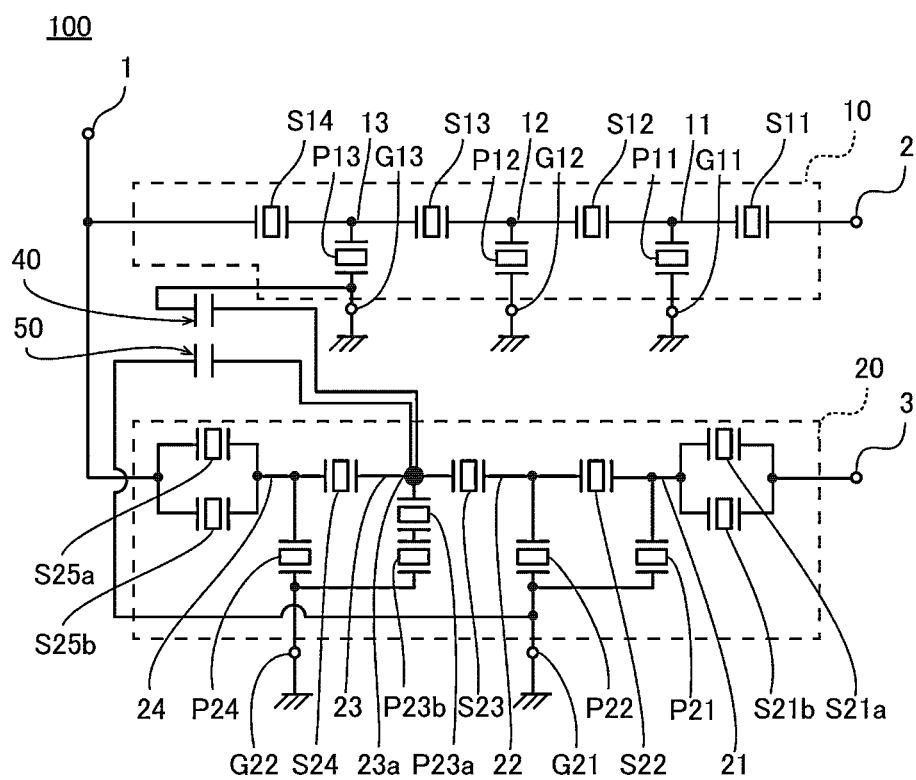
FIG. 1 is a circuit diagram of a composite filter device 100 according to a preferred embodiment of the present invention.

In a composite filter device including a piezoelectric substrate on which a first acoustic wave filter having a first pass band and a second acoustic wave filter having a second pass band higher than the first pass band are provided, it is desirable to improve attenuation characteristics and isolation characteristics of the second acoustic wave filter.

Accordingly, it is considered to improve the attenuation characteristics and the isolation characteristics of the second acoustic wave filter by providing a capacitance element between the second acoustic wave filter and a reference potential. However, providing the capacitance element increases both a capacitance component of an impedance of the first pass band in the first acoustic wave filter and a capacitance component of an impedance of the second pass band in the second acoustic wave filter. As a result, this results in a problem in that bandpass characteristics of the composite filter device deteriorate.

In view of such a problem, the inventor of preferred embodiments of the present invention has developed composite filter devices each capable of improving attenuation characteristics and isolation characteristics while preventing bandpass characteristic from deteriorating.

Hereinafter, preferred embodiments of the present invention will be described with reference to drawings. The present invention is not limited to the following preferred embodiments, and design thereof can be changed as appropriate within a range that satisfies a configuration of the present invention. In the following descriptions, the same portions or portions having similar functions are denoted by the same reference numerals in common in different drawings, and descriptions thereof are not repeated. In addition, configurations described in the preferred embodiments and the modification examples may be appropriately combined or changed without departing from the scope of the present invention. Further, to make the descriptions easy to understand, in the drawings referred to below, the configuration is illustrated in a simplified or schematic manner, or some elements are omitted. Dimensional ratios between the elements illustrated in the drawings do not necessarily indicate actual dimensional ratios.

Overall Configuration of Composite Filter Device 100

FIG. 1 is a circuit diagram of a composite filter device 100 according to a preferred embodiment of the present invention. The composite filter device 100 includes a transmission filter 10 and a reception filter 20. In the present preferred embodiment, the composite filter device 100 is a duplexer, for example. A pass band of the reception filter 20 has a frequency band that is higher than a pass band of the transmission filter 10. The composite filter device 100 can be used for communication in a band from about 700 MHz to about 6 GHz, for example. For example, the composite filter device 100 can be used for communication in a frequency band defined by the Third Generation Partnership Project (3GPP) (registered trademark) standard.

As illustrated in FIG. 1, the composite filter device 100 includes an antenna terminal 1 connected to an antenna (not illustrated), a transmission terminal 2, and a reception terminal 3. The transmission filter 10 is disposed between the antenna terminal 1 and the transmission terminal 2. The reception filter 20 is disposed between the antenna terminal 1 and the reception terminal 3. As illustrated in FIG. 1, each of the transmission filter 10 and the reception filter 20 includes a ladder circuit including a plurality of series arm resonators and a plurality of parallel arm resonators.

Further, the composite filter device 100 includes reference potential terminals G11, G12, G13, G21, and G22, as illustrated in FIG. 1. The reference potential terminals G11, G12, G13, and G22 are ground bumps, and are connected to the ground potential via wiring. It includes the reference potential terminals G11, G12, G13, G21, and G22. The reference potential terminals G11, G12, G13, G21, and G22 include, for example, bumps made of Au or solder, and conductive connection structures such as conductive adhesives.

In the present preferred embodiment, the composite filter device 100 includes a first capacitance element 40 and a second capacitance element 50. The first capacitance element 40 is disposed between a signal line 23 in the reception filter 20 and the reference potential terminal G13. The second capacitance element 50 is disposed between the signal line 23 in the reception filter 20 and the reference potential terminal G21. The first capacitance element 40 and the second capacitance element 50 can improve attenuation characteristics and isolation characteristics of the reception filter 20 while preventing bandpass characteristics of the composite filter device 100 from deteriorating.

Figure 2:
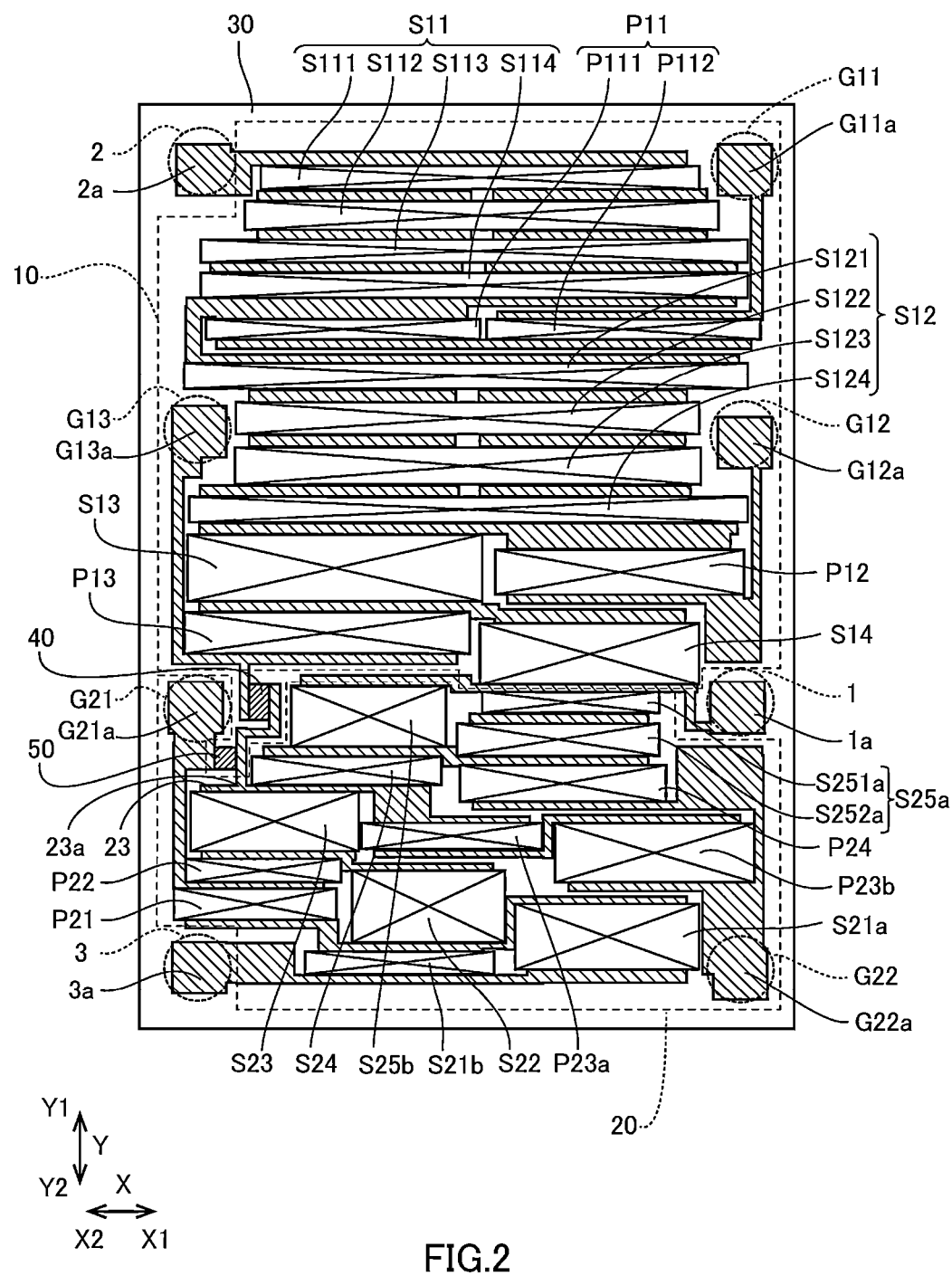
FIG. 2 is a plan view of a composite filter device 100 according to a preferred embodiment of the present invention.

FIG. 2 is a plan view of the composite filter device 100 according to the present preferred embodiment. For convenience of description, an X-axis and a Y-axis are defined to indicate directions in FIG. 2. The X-axis illustrated in FIG. 2 is horizontal to the paper surface of FIG. 2. A direction from left to right along the X-axis on the paper surface of FIG. 2 is referred to as an X1 direction, while a direction from right to left is referred to as an X2 direction. In the following description, a direction along the X-axis that is irrespective of the direction to left or the direction to right may be referred to as an "X direction". Similarly, a direction from bottom to top along the Y-axis on the paper surface of FIG. 2 is referred to as a "Y1 direction", while a direction from top to bottom along the Y-axis is referred to as a "Y2 direction". A direction along the Y-axis that is irrespective of the direction to top or the direction to bottom may be referred to as a "Y direction". Directions are similarly defined in FIG. 3 and the subsequent drawings. As illustrated in FIG. 2, the composite filter device 100 includes a piezoelectric substrate 30. The piezoelectric substrate 30 is made of, for example, piezoelectric single crystals such as $LiTiO_3$ or $LiNbO_3$. Alternatively, the piezoelectric substrate 30 may be made of piezoelectric ceramics instead of piezoelectric single crystals. The piezoelectric substrate 30 may have a laminate structure including a piezoelectric thin film stacked on a support substrate. The transmission filter 10 and the reception filter 20 are disposed on the piezoelectric substrate 30.

As illustrated in FIG. 2, an antenna electrode 1a connected to the antenna terminal 1, a transmission electrode 2a connected to the transmission terminal 2, and a reception electrode 3a connected to the reception terminal 3 are provided on the piezoelectric substrate 30. Further, reference potential electrodes G11a, G12a, and G13a connected to the reference potential terminals G11, G12, and G13, respectively, are provided on the piezoelectric substrate 30. In addition, reference potential electrodes G21a and G22a connected to the reference potential terminals G21 and G22, respectively, are provided on the piezoelectric substrate 30. The antenna electrode 1a, the transmission electrode 2a, the reception electrode 3a as well as the reference potential electrodes G11a, G12a, G13a, G21a, and G22a are made of, for example, a metal material including Al, Cu, Ag, Au, Pt, or an alloy mainly including these metals.

As illustrated in FIG. 2, the transmission electrode 2a, the reference potential electrodes G13a and G21a, and the reception electrode 3a are spaced apart from one another in the above order in the Y2 direction on the piezoelectric substrate 30. The reference potential electrode G11a is disposed in the X1 direction when viewed from the transmission electrode 2a. In addition, the reference potential electrodes G11a, G12a, the antenna electrode 1a, and the reference potential electrode G22a are arranged spaced from one another in the above order in the Y2 direction on the piezoelectric substrate 30.

Configuration of Transmission Filter 10

As illustrated in FIG. 1, the transmission filter 10 includes series arm resonators S11, S12, S13, and S14 and parallel arm resonators P11, P12, and P13. Each of the series arm resonators S11 to S14 and the parallel arm resonators P11 to P13 is defined by a surface acoustic wave resonator. In FIG. 1, each of the series arm resonators S11, S12, S13, and S14 and the parallel arm resonators P11, P12, and P13 is illustrated as one resonator, but is not limited thereto. In other words, each of the series arm resonators S11, S12, S13, and S14 and parallel arm resonators P11, P12, and P13 may include a plurality of surface acoustic wave resonators. It means that, in FIG. 1, for ease of description, a resonator group is collectively represented as one resonator in which a plurality of surface acoustic wave resonators are connected to each other in series without including, between the plurality of surface acoustic wave resonators, a branch point to a signal path having other resonators. The surface acoustic wave resonators may have different configurations (e.g., number of pairs, overlap width, and pitch) from each other.

As illustrated in FIG. 1, the series arm resonators S11 to S14 are connected to each other in series between the transmission terminal 2 and the antenna terminal 1. The transmission filter 10 includes signal lines 11, 12, and 13. Here, the "signal line" means a line that directly connects a plurality of series arm resonators to each other among lines on a signal path connecting the input and output terminals. "A plurality of series arm resonators are directly connected to each other" means that other resonators are not connected in series between a plurality of (e.g., two) series arm resonators that are connected to each other. The signal line 11 directly connects the series arm resonator S11 and the series arm resonator S12. The signal line 12 directly connects the series arm resonator S12 and the series arm resonator S13. The signal line 13 directly connects the series arm resonator S13 and the series arm resonator S14. One end of the parallel arm resonator P11 is connected to the reference potential terminal G11, while the second end of the parallel arm resonator P11 is connected to the signal line 11. One end of the parallel arm resonator P12 is connected to the reference potential terminal G12, while the second end of the parallel arm resonator P12 is connected to the signal line 12. One end of the parallel arm resonator P13 is connected to the reference potential terminal G13, while the second end of the parallel arm resonator P13 is connected to the signal line 13. In other words, a ladder unbalanced circuit is provided in the transmission filter 10. The signal lines 11 to 13 are HOT lines in the transmission filter 10.

Here, in FIG. 2, for ease of description, each of the resonators is illustrated as a rectangular frame (Q) with a symbol x. In addition, each of the resonators illustrated in FIG. 2 includes an IDT electrode 61 and reflectors 62 and 63 which are described later with reference to FIG. 3. A configuration of the resonators is not limited to the example of FIG. 3, and the resonators do not necessarily include the reflectors 62 and 63. As illustrated in FIG. 2, the transmission filter 10 is located on the piezoelectric substrate 30 in the Y1 direction when viewed from the reception filter 20. The series arm resonator S11 includes, for example, resonators S111, S112, S113, and S114. The resonators S111, S112, S113, and S114 are arranged in the above order in the Y2 direction on the piezoelectric substrate 30. The resonator S111 is connected to the transmission electrode 2a. The resonators S111, S112, S113, and S114 are connected to each other in series.

The parallel arm resonator P11 includes, for example, resonators P111 and P112. The resonators P111 and P112 are arranged side by side in the X direction at a position in the Y2 direction when viewed from the resonator S114. The resonator P111 is connected to the resonators S114 and P112, while the resonator P112 is connected to the reference potential electrode G11a.

The series arm resonator S12 includes, for example, resonators S121, S122, S123, and S124. The resonator S121 is located in the Y2 direction when viewed from the resonators P111 and P112. The resonators S121, S122, S123, and S124 are arranged side by side in the Y2 direction. The resonator S121 is connected to the resonator S114 and the resonator P111. The resonators S121, S122, S123, and S124 are connected to each other in series in the above order.

The parallel arm resonator P12 is connected to the resonator S124 and the reference potential electrode G12a. The parallel arm resonator P12 is located in the Y2 direction when viewed from the resonator S124. Note that, though not illustrated, the parallel arm resonators P12 and P13 and the series arm resonators S13 and S14 include a plurality of resonators connected in series to each other.

The series arm resonator S13 is connected to the resonator S124 and the parallel arm resonator P12. The series arm resonator S13 is located in the Y2 direction when viewed from the resonator S124 and in the X2 direction when viewed from the parallel arm resonator P12.

The parallel arm resonator P13 is connected to the series arm resonator S13 and the reference potential electrode G13a. The parallel arm resonator P13 is located in the Y2 direction when viewed from the series arm resonator S13.

The series arm resonator S14 is connected to the series arm resonator S13, the parallel arm resonator P13, and the antenna electrode 1a. The series arm resonator S14 is located in the Y2 direction when viewed from the parallel arm resonator P12.

Configuration of Reception Filter 20

As illustrated in FIG. 1, the reception filter 20 includes series arm resonators S21a, S21b, S22, S23, S24, S25a, and S25b and parallel arm resonators P21, P22, P23a, P23b, and P24. Each of the series arm resonators S21a to S25b and the parallel arm resonators P21 to P24 is composed of a surface acoustic wave resonator. Note that, in FIG. 1, each of the series arm resonators S21a, S21b, S22, S23, S24, S25a, and S25b and the parallel arm resonators P21, P22, P23a, P23b, and P24 is illustrated as one resonator, but is not limited thereto. In other words, each of the series arm resonators S21a, S21b, S22, S23, S24, S25a, and S25b and the parallel arm resonators P21, P22, P23, and P24 may be composed of a plurality of surface acoustic wave resonators. It means that, in FIG. 1, for ease of description, a resonator group is collectively represented as one resonator in which a plurality of surface acoustic wave resonators are connected to each other in series without including, between the plurality of surface acoustic wave resonators, a branch point to a signal path having other resonators. Note that the surface acoustic wave resonators may have different configurations (e.g., number of pairs, overlap width, and pitch) from each other.

The series arm resonators S21a, S22, S23, S24, and S25a are connected to each other in series between the reception terminal 3 and the antenna terminal 1, as illustrated in FIG. 1. The series arm resonators S21a and S21b are connected in parallel. The series arm resonators S25a and S25b are connected in parallel.

Further, the reception filter 20 includes signal lines 21, 22, 23, and 24. The signal line 21 directly connects the series arm resonators S21a and S21b and the series arm resonator S22. The signal line 22 directly connects the series arm resonator S22 and the series arm resonator S23. The signal line 23 directly connects the series arm resonator S23 and the series arm resonator S24. The signal line 24 directly connects the series arm resonator S24 and the series arm resonators S25a and S25b. One end of the parallel arm resonator P21 is connected to the reference potential terminal G21. The second end of the parallel arm resonator P21 is connected to the signal line 21. One end of the parallel arm resonator P22 is connected to the reference potential terminal G21. The second end of the parallel arm resonator P22 is connected to the signal line 22. One end of the parallel arm resonator P23a is connected to the parallel arm resonator P23b. The second end of the parallel arm resonator P23a is connected to the signal line 23. One end of the parallel arm resonator P23b is connected to the reference potential terminal G22. The second end of the parallel arm resonator P23b is connected to the parallel arm resonator P23a. One end of the parallel arm resonator P24 is connected to the reference potential terminal G22. The second end of the parallel arm resonator P24 is connected to the signal line 24. In other words, the reception filter 20 includes a ladder unbalanced circuit. The signal lines 21 to 24 are HOT lines in the reception filter 20.

As illustrated in FIG. 2, the reception filter 20 is disposed on the piezoelectric substrate 30. The series arm resonator S21b is disposed at an end portion in the Y2 direction of elements provided on the piezoelectric substrate 30. The series arm resonators S21a and S21b are arranged side by side in the X direction. Both the series arm resonators S21a and S21b are connected to the reception electrode 3a.

The parallel arm resonator P21 is located in the Y1 direction when viewed from the series arm resonator S21b. The parallel arm resonator P21 is connected to the series arm resonators S21a and S21b and the reference potential electrode G21a.

The series arm resonator S22 is located in the Y1 direction when viewed from the series arm resonator S21b and between the parallel arm resonator P21 and the series arm resonator S21a. The series arm resonator S22 is connected to the series arm resonators S21a and S21b and the parallel arm resonators P21 and P22.

The parallel arm resonator P22 is located in the Y1 direction when viewed from the parallel arm resonator P21. The parallel arm resonator P22 is connected to the parallel arm resonator P21, the series arm resonator S22, and the reference potential electrode G21a.

The series arm resonator S23 is located in the Y1 direction when viewed from the parallel arm resonator P22. The series arm resonator S23 is connected to the series arm resonator S22 and the parallel arm resonator P22.

The parallel arm resonator P23a is located in the Y1 direction when viewed from the series arm resonator S22. The parallel arm resonator P23a is connected to the parallel arm resonator P23b and the series arm resonator S23. The parallel arm resonator P23b is located in the X1 direction when viewed from the parallel arm resonator P23a. The parallel arm resonator P23b is connected to the reference potential electrode G22a.

The series arm resonator S24 is located in the Y1 direction when viewed from the series arm resonator S23. The series arm resonator S24 is connected to the series arm resonator S23 and the parallel arm resonator P23a.

The parallel arm resonator P24 is located in the Y1 direction when viewed from the parallel arm resonator P23b. The parallel arm resonator P24 is connected to the parallel arm resonator P23b, the series arm resonator S24, and the reference potential electrode G22a.

The series arm resonator S25a includes resonators S251a and S251b. The resonators S251a and S251b are located in the Y1 direction when viewed from the parallel arm resonator P24. The resonators S251a and S251b are connected to each other in series. The resonator S251a is connected to the antenna electrode 1a and the series arm resonator S14. The resonator S251b is connected to the parallel arm resonator P24 and the series arm resonator S24. The series arm resonator S25a is arranged adjacent to the antenna electrode 1a.

The series arm resonator S25b is located in the Y1 direction when viewed from the series arm resonator S24. The series arm resonator S25b is connected to the antenna electrode 1a, the series arm resonator S14, and the resonator S251b.

Configuration of Resonator S111

Figure 3:
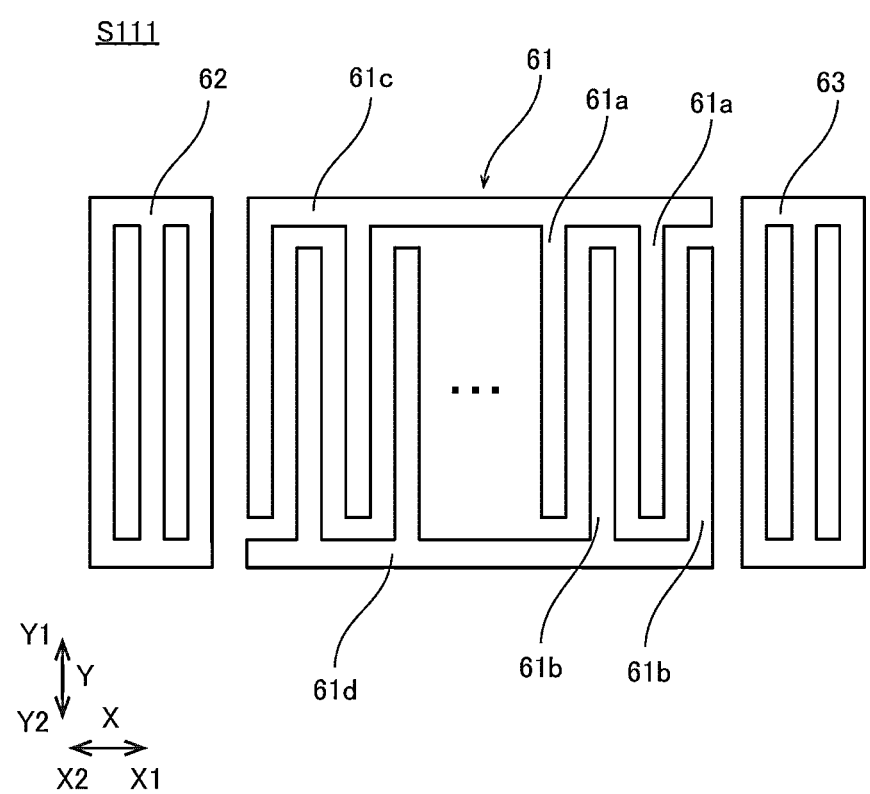
FIG. 3 is a diagram schematically illustrating a configuration of a resonator S111 according to a preferred embodiment of the present invention.

FIG. 3 is a diagram schematically illustrating the configuration of the resonator S111. The resonator S111 includes the IDT (Inter Digital Transducer) electrode 61, the reflector 62 disposed in the X2 direction when viewed from the IDT electrode 61, and the reflector 63 disposed in the X1 direction when viewed from the IDT electrode 61. For example, the IDT electrode 61 and the reflectors 62 and 63 are made of a metal material including Al, Cu, Ag, Au, Pt, or an alloy mainly including these metals. The IDT electrode 61 includes a pair of comb-shaped electrodes with a plurality of electrode fingers 61a and a plurality of electrode fingers 61b interdigitated each other and bus bars 61c and 61d. The plurality of electrode fingers 61a extend in the Y2 direction from the bus bar 61c. The plurality of electrode fingers 61b extend in the Y1 direction from the bus bar 61d. As a result, acoustic waves generated on the piezoelectric substrate 30 propagate in the X direction. In resonators other than the resonator S111 (the resonators in the transmission filter 10 and the resonators in the reception filter 20), the electrode fingers extend in the Y1 or Y2 direction. Although the resonators other than the resonator S111 differ from the resonator S111 in parameters such as the number of electrode fingers, the length of electrode fingers in the Y direction, the width of electrode fingers, and the spacing between electrode fingers, the basic configuration is the same as that of the resonator S111, and thus the description and illustration thereof are omitted.

Configuration of the First Capacitance Element 40 and the Second Capacitance Element 50

As illustrated in FIG. 1, the first capacitance element 40 is disposed between the signal line 23 in the reception filter 20 and the reference potential terminal G13. The second capacitance element 50 is disposed between the signal line 23 in the reception filter 20 and the reference potential terminal G21. The point where the first capacitance element 40 and the second capacitance element 50 are connected to the signal line 23 is designated as a node 23a. The "node 23a" is defined as a "point" for the purpose of describing the circuit diagram in FIG. 1. In other words, the connection point between the first capacitance element 40 and the signal line 23 and the connection point between the second capacitance element 50 and the signal line 23 are not limited to the same position, and may be at different positions.

As illustrated in FIG. 1, by disposing the first capacitance element 40 in the composite filter device 100, a closed circuit including the first capacitance element 40, the parallel arm resonator P13 and series arm resonator S14 of the transmission filter 10, the series arm resonators S25a and S25b, the series arm resonator S24, and the node 23a of the reception filter 20 is formed. Here, the pass band of the transmission filter 10 is defined as R1. The pass band of the reception filter 20 is defined as R2. By forming the above closed circuit, the pole positions of the pass band R2 (e.g., about 2350 MHz to about 2360 MHz) in the transmission filter 10 can be changed to change the attenuation characteristics.

By connecting the second capacitance element 50 between the signal line 23 (HOT line) of the reception filter 20 and the reference potential terminal G21, a closed circuit including the second capacitance element 50, the series arm resonator S23 and the parallel arm resonator P22 is formed, and a closed circuit including the second capacitance element 50, the series arm resonators S23 and S22, and the parallel arm resonator P21 are formed. This allows the capacitance values of some of these resonators to be changed and the attenuation characteristics in bands other than the pass band in the reception filter 20 to be changed.

The first capacitance element 40 and the second capacitance element 50 are connected to the signal line 23 of the reception filter 20. This allows the impedance characteristics of each of the transmission filter 10 and the reception filter 20 to be adjusted, making it easier to control changes in the bandpass characteristics. As a result, the attenuation characteristics in a counterpart band of the transmission filter 10, the attenuation characteristics in bands other than the pass band of the reception filter 20, and the isolation characteristics in the pass band of the reception filter 20 can be improved, while preventing deterioration of the bandpass characteristics.

Here, when the signal line to which the first capacitance element 40 is connected and the signal line to which the second capacitance element 50 is connected are different, a resonator is included between the point where the first capacitance element 40 is connected to the signal line and the point where the second capacitance element 50 is connected to the signal line. In this case, the adjustable bandwidth range of the attenuation characteristics in the range where the bandpass characteristics are not affected is limited. In contrast, in the configuration of FIG. 1, both the first capacitance element 40 and the second capacitance element 50 are connected to the node 23a. This allows the adjustable bandwidth range of the attenuation characteristics to be expanded. It also makes it easier to adjust the impedance characteristics of each of the transmission filter 10 and the reception filter 20, thus making it easier to control changes in the bandpass characteristics.

As illustrated in FIG. 2, the first capacitance element 40 and the second capacitance element 50 are disposed on the piezoelectric substrate 30. For example, in plan view, the first capacitance element 40 and the second capacitance element 50 are disposed between the transmission filter 10 and the reception filter 20. The first capacitance element 40 is connected to the reference potential electrode G13a.

Figure 4:
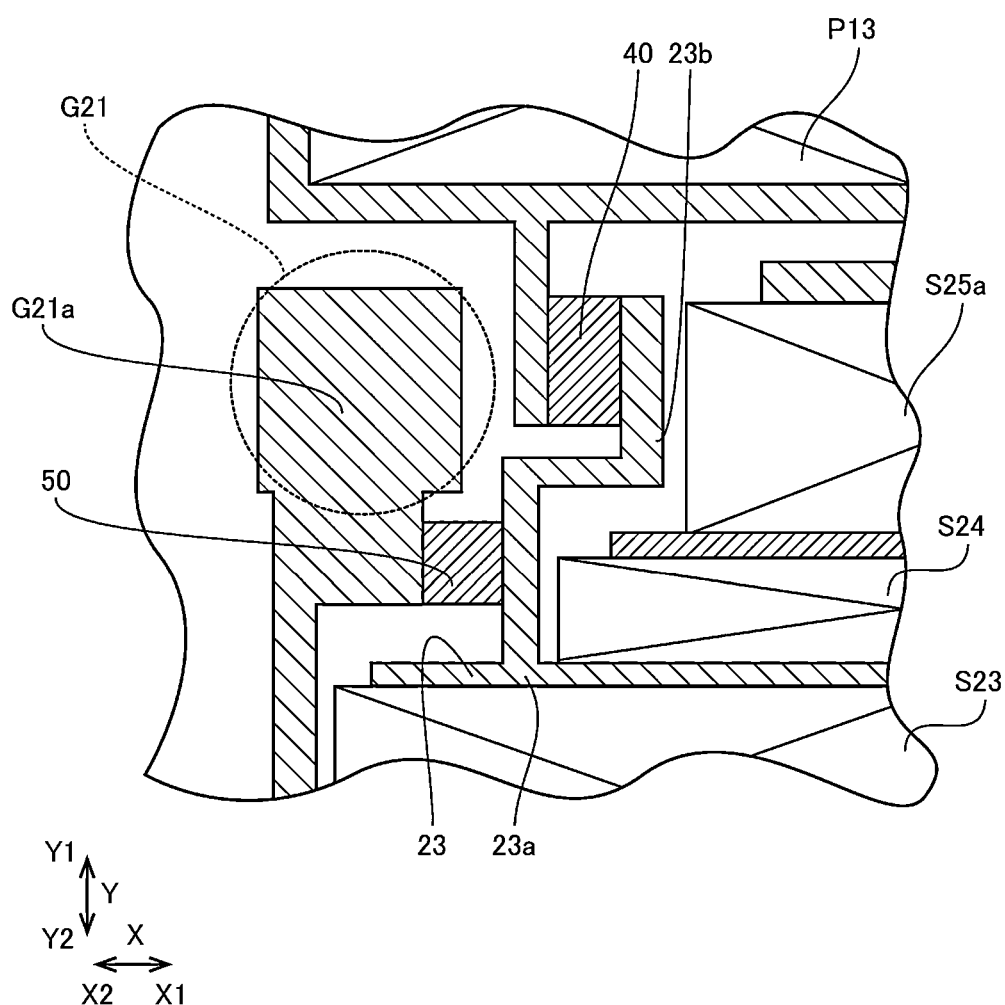
FIG. 4 is a diagram illustrating an arrangement of a first capacitance element 40 and a second capacitance element 50 on a piezoelectric substrate 30.

FIG. 4 is a diagram illustrating the disposition of the first capacitance element 40 and the second capacitance element 50 on the piezoelectric substrate 30. As illustrated in FIG. 4, the first capacitance element 40 and the second capacitance element 50 are disposed next to each other in plan view on the piezoelectric substrate 30. "The first capacitance element 40 and the second capacitance element 50 are disposed next to each other" means that no other elements such as resonators are disposed between the first capacitance element 40 and the second capacitance element 50, and that the concept includes a state in which wiring or space is formed between the first capacitance element 40 and the second capacitance element 50. The first capacitance element 40 and the second capacitance element 50 are connected via a wiring line 23b. The wiring line 23b is connected to the node 23a. As a result, an increase in the resistance and inductance of the wiring line 23b connecting the first capacitance element 40 and the second capacitance element 50 can be reduced or prevented compared to a case where the first capacitance element and the second capacitance element are disposed apart from each other. As a result, the wiring line 23b can be prevented from affecting the characteristics of the composite filter device 100.

The second capacitance element 50 and the reference potential electrode G21a are disposed next to each other in plan view. The second capacitance element 50 and the reference potential electrode G21a are connected. As a result, the resistance and inductance of the wiring connecting the second capacitance element 50 and the reference potential electrode G21a can be prevented from increasing compared to a case where the second capacitance element and the reference potential electrode are disposed apart from each other. As a result, the wiring connecting the second capacitance element 50 and the reference potential electrode G21a can be prevented from affecting the characteristics of the composite filter device 100.

As illustrated in FIG. 4, the node 23a where the first capacitance element 40 and the second capacitance element 50 are connected is disposed between the second capacitance element 50 and the series arm resonator S23. The first capacitance element 40 and the second capacitance element 50 are disposed between the series arm resonator S23 of the reception filter 20 and the parallel arm resonator P13 of the transmission filter 10 in plan view on the piezoelectric substrate 30. For example, the first capacitance element 40 and the second capacitance element 50 are disposed in the Y1 direction when viewed from the series arm resonator S23. The first capacitance element 40 and the second capacitance element 50 are disposed in the Y2 direction when viewed from the parallel arm resonator P13. As a result, the parallel arm resonator P13, which is connected to the first capacitance element 40, and the series arm resonator S23, to which the first capacitance element 40 and the second capacitance element 50 are connected, are disposed close to the first capacitance element 40 and the second capacitance element 50, respectively. As a result, an increase in the resistance and inductance of the wiring connecting the first capacitance element 40 and the parallel arm resonator P13 can be reduced or prevented. In addition, an increase in the resistance and inductance of the wiring connecting the second capacitance element 50 and the series arm resonator S23 can be reduced or prevented. Although the present preferred embodiment illustrates an example in which the first capacitance element 40 and the second capacitance element 50 are disposed between the series arm resonator S23 and the parallel arm resonator P13 in plan view, the present disclosure is not limited to this example. For example, the first capacitance element 40 and the second capacitance element 50 may be disposed between the series arm resonator S24 and the parallel arm resonator P13 in plan view. In this case, an increase in the resistance and inductance of the wiring connecting the second capacitance element 50 and the series arm resonator S24 can be reduced or prevented.

Figure 5:
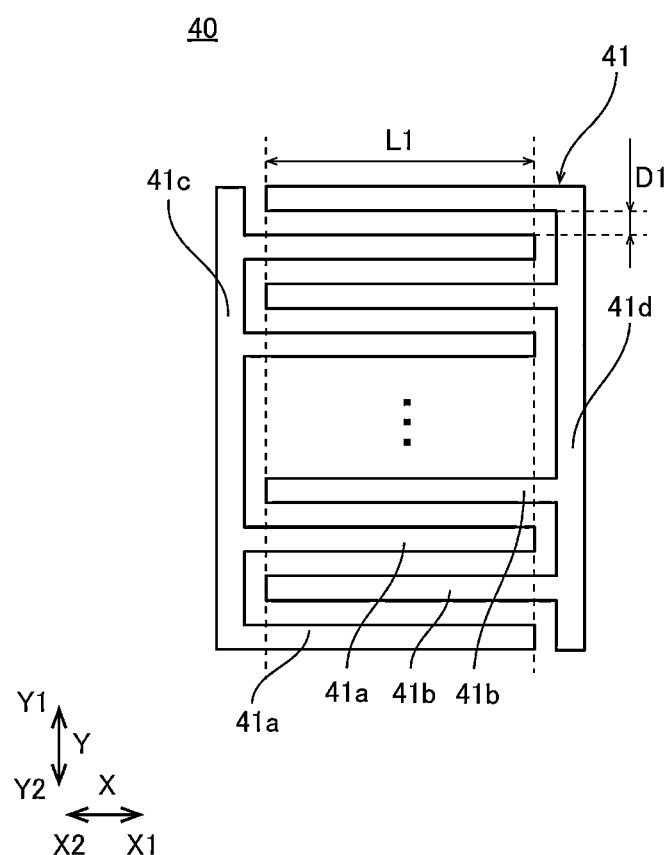
FIG. 5 is a diagram schematically illustrating a configuration of a first capacitance element 40 according to a preferred embodiment of the present invention.
Figure 6:
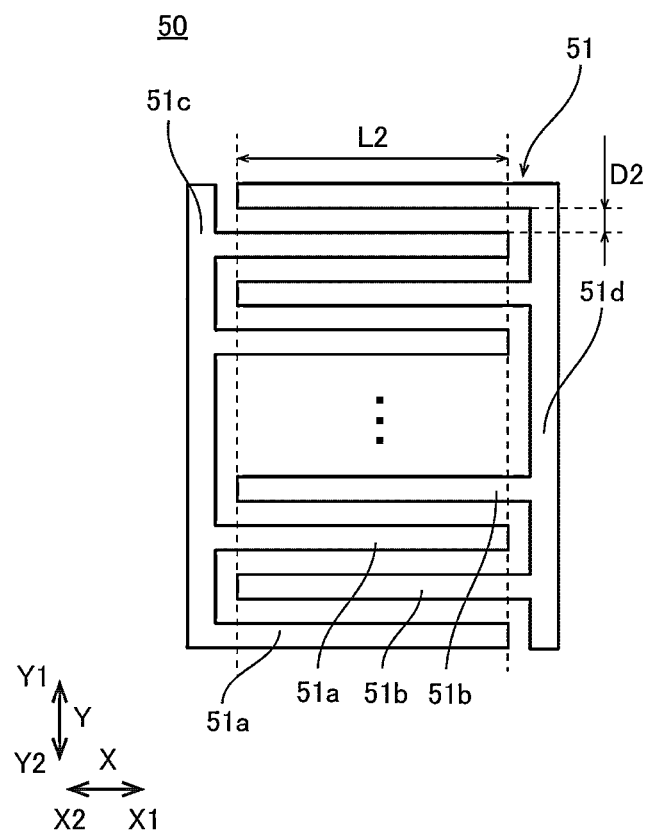
FIG. 6 is a diagram schematically illustrating a configuration of a second capacitance element 50 according to a preferred embodiment of the present invention.

FIG. 5 is a diagram schematically illustrating the configuration of the first capacitance element 40 according to the present preferred embodiment, and FIG. 6 is a diagram schematically illustrating the configuration of the second capacitance element 50 according to the present preferred embodiment. As illustrated in FIG. 5, in the present preferred embodiment, the first capacitance element 40 includes an IDT electrode 41. For example, the IDT electrode 41 includes the same material as the IDT electrode 61. For example, the IDT electrode 41 is made of a metal material including Al, Cu, Ag, Au, Pt, or an alloy mainly including these metals. The IDT electrode 41 includes a pair of comb-shaped electrodes with a plurality of electrode fingers 41a and a plurality of electrode fingers 41b interdigitated each other and bus bars 41c and 41d. The plurality of electrode fingers 41a extend in the X1 direction from the bus bar 41c. The plurality of electrode fingers 41b extend in the X2 direction from the bus bar 41d. In other words, the directions in which the electrode fingers 41a and 41b of the IDT electrode 41 extend intersect the directions in which the electrode fingers 61a and 61b of the IDT electrode 61 extend (Y1 or Y2 direction). In the present preferred embodiment, the directions in which the electrode fingers 41a and 41b of the IDT electrode 41 extend are orthogonal to the directions in which the electrode fingers 61a and 61b of the IDT electrode 61 extend.

As illustrated in FIG. 6, the second capacitance element 50 in the present preferred embodiment includes an IDT electrode 51. For example, the IDT electrode 51 is made of the same material as the IDT electrode 61. For example, the IDT electrode 51 is made of a metal material including Al, Cu, Ag, Au, Pt, or an alloy mainly including these metals. The IDT electrode 51 includes a pair of comb-shaped electrodes with a plurality of electrode fingers 51a and a plurality of electrode fingers 51b interdigitated each other, and bus bars 51c and 51d. The plurality of electrode fingers 51a extend in the X1 direction from the bus bar 51c. The plurality of electrode fingers 51b extend in the X2 direction from the bus bar 51d. In other words, the directions in which the electrode fingers 51a and 51b of the IDT electrode 51 extend intersect the directions in which the electrode fingers 61a and 61b of the IDT electrode 61 extend. In the present preferred embodiment, the directions in which the electrode fingers 51a and 51b of the IDT electrode 51 extend are orthogonal to the directions in which the electrode fingers 61a and 61b of the IDT electrode 61 extend.

In the present preferred embodiment, the electrical capacitance of the first capacitance element 40 is larger than the electrical capacitance of the second capacitance element 50. For example, the electrical capacitance of the first capacitance element 40 is set to be greater than the electrical capacitance of the second capacitance element 50 and less than twice the electrical capacitance of the second capacitance element 50. As illustrated in FIG. 5, the electrical capacitance of the first capacitance element 40 is proportional to the length L1 where the electrode fingers 41a and the electrode fingers 41b in the IDT electrode 41 overlap in the X direction. The electrical capacitance of the first capacitance element 40 is inversely proportional to the distance D1 (gap) between the electrode fingers 41a and the electrode fingers 41b in the X direction. The electrical capacitance of the first capacitance element 40 is proportional to the number of pairs (number of comb teeth) of the electrode fingers 41a and 41b. The electrical capacitance of the first capacitance element 40 is proportional to the thickness (length in the direction orthogonal to the X-axis and the Y-axis) of the electrode fingers 41a and 41b in the IDT electrode 41. As illustrated in FIG. 6, the electrical capacitance of the second capacitance element 50 is proportional to the length L2 where the electrode fingers 51a and the electrode fingers 51b in the IDT electrode 51 overlap in the X direction. The electrical capacitance of the second capacitance element 50 is inversely proportional to the distance D2 (gap) between the electrode fingers 51a and the electrode fingers 51b in the X direction. The electrical capacitance of the second capacitance element 50 is proportional to the number of pairs (number of comb teeth) of the electrode fingers 51a and 51b. The electrical capacitance of the second capacitance element 50 is proportional to the thickness (length in the direction orthogonal to the X-axis and Y-axis) of the electrode fingers 51a and 51b in the IDT electrode 51. For example, if the thickness of the IDT electrode 41 is equal to the thickness of the IDT electrode 51 and the number of comb teeth of the IDT electrode 41 is equal to the number of comb teeth of the IDT electrode 51, if the length L1 is greater than the length L2 or the distance D1 is less than the distance D2, then the electrical capacitance of the first capacitance element 40 is greater than the electrical capacitance of the second capacitance element 50. Not limited thereto, the thickness of the IDT electrode 41 may be made larger than the thickness of the IDT electrode 51 to make the electrical capacitance of the first capacitance element 40 larger than that of the second capacitance element 50. The number of comb teeth of the IDT electrode 41 may be made larger than the number of comb teeth of the IDT electrode 51, and the electrical capacitance of the first capacitance element 40 may be larger than that of the second capacitance element 50.

Based on this, the acoustic wave from each resonator that propagates in the X1 direction or the X2 direction on the piezoelectric substrate 30 can be prevented from affecting the IDT electrode 41 and the IDT electrode 51. In addition, since the IDT electrode 41 and the IDT electrode 51 can be prevented from affecting other resonators, the IDT electrode 41 and the IDT electrode 51 can be prevented from affecting bandpass characteristics of the transmission filter 10 and bandpass characteristics of the reception filter 20. Since the first capacitance element 40 includes the IDT electrode 41 and the second capacitance element 50 includes the IDT electrode 51, the IDT electrodes can be made according to the same process and using the same materials when manufacturing the IDT electrodes of the transmission filter 10 and the reception filter 20. As a result, the number of processes for manufacturing the composite filter device 100 can be reduced.

Results of Comparison Between Examples of the Present Preferred Embodiment and Comparative Examples Referring to FIG. 7 through FIG. 11, the results of the characteristics of the composite filter device 100 of the present preferred embodiment obtained by simulation will be described, while being compared with the results according to the comparative examples.

As an example of the present preferred embodiment, the composite filter device 100 was configured such that the pass band R1 of the transmission filter 10 was 2305 MHz to 2315 MHz and the pass band R2 of the reception filter 20 was 2350 MHz to 2360 MHz. The comparative example was a composite filter device obtained by excluding the first capacitance element 40 and the second capacitance element 50 from the composite filter device 100 according to the present preferred embodiment. The comparative example was configured to confirm the effect of the composite filter device 100 according to the present preferred embodiment and is not a conventional technology.

Figure 7:
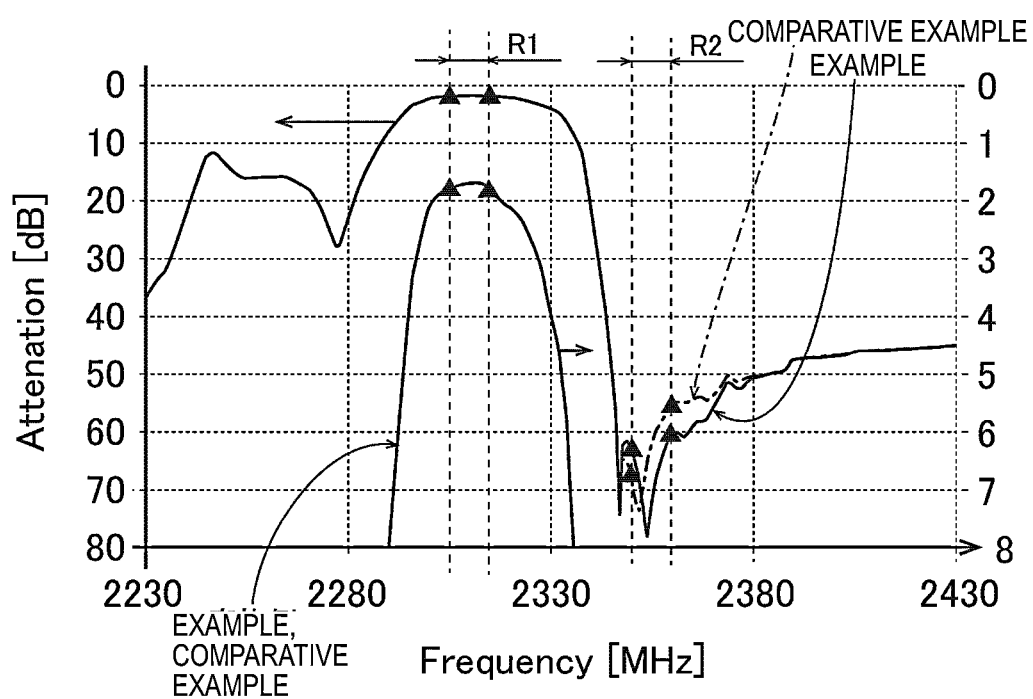
FIG. 7 is a diagram illustrating bandpass characteristics of a transmission filter 10 according to an example of a preferred embodiment of the present invention and bandpass characteristics of a transmission filter according to a comparative example.

FIG. 7 is a diagram illustrating the bandpass characteristics of the transmission filter 10 according to the present preferred embodiment and the bandpass characteristics of the transmission filter according to a comparative example. As illustrated in FIG. 7, the bandpass characteristics of the transmission filter 10 according to the present preferred embodiment and the bandpass characteristics of the transmission filter according to the comparative example were obtained by simulation. As illustrated in FIG. 7, in the transmission filter 10 according to the present preferred embodiment, the pole positions of the attenuation of the pass band R2 of the transmission filter 10 changed with respect to the transmission filter according to the comparative example. As a result, in at least some frequency bands in the pass band R2, the attenuation by the present preferred embodiment was larger than that of the comparative example. The pass band R1 of the transmission filter had the same value for the result of the present preferred embodiment and for the result of the comparative example. Therefore, according to this example, it was found that by providing the first capacitance element 40 and the second capacitance element 50, the attenuation in the counterpart band of the transmission filter 10 can be increased, while maintaining the bandpass characteristics of the transmission filter 10.

Figure 8:
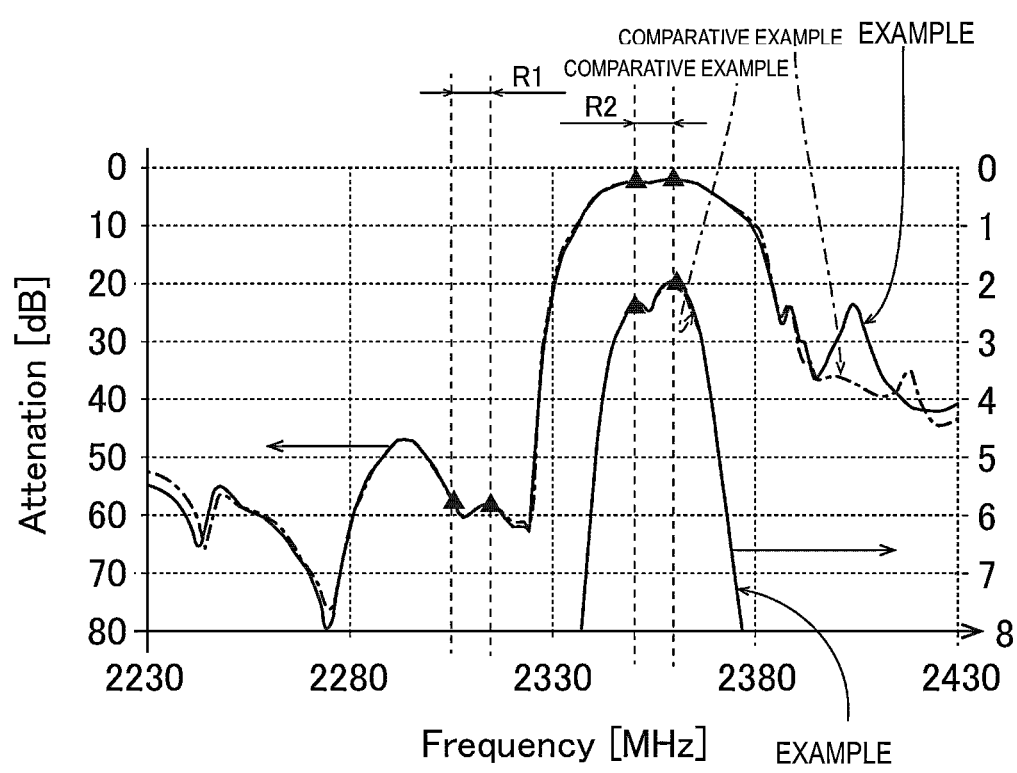
FIG. 8 is a diagram illustrating bandpass characteristics of a reception filter 20 according to an example of a preferred embodiment of the present invention and bandpass characteristics of a reception filter according to a comparative example.

FIG. 8 is a diagram illustrating the bandpass characteristics of the reception filter 20 according to the present preferred embodiment and the bandpass characteristics of the reception filter according to the comparative example. As illustrated in FIG. 8, the bandpass characteristics of the reception filter 20 according to the present preferred embodiment and the bandpass characteristics of the reception filter according to the comparative example were obtained by simulation. As illustrated in FIG. 8, in the pass band R2 of the reception filter, the attenuation of the reception filter 20 according to the present preferred embodiment was not larger than that of the reception filter according to the comparative example. In other words, according to this example, the bandpass characteristics of the reception filter 20 were maintained even when the first capacitance element 40 and the second capacitance element 50 were provided in the composite filter device 100.

Figure 9:
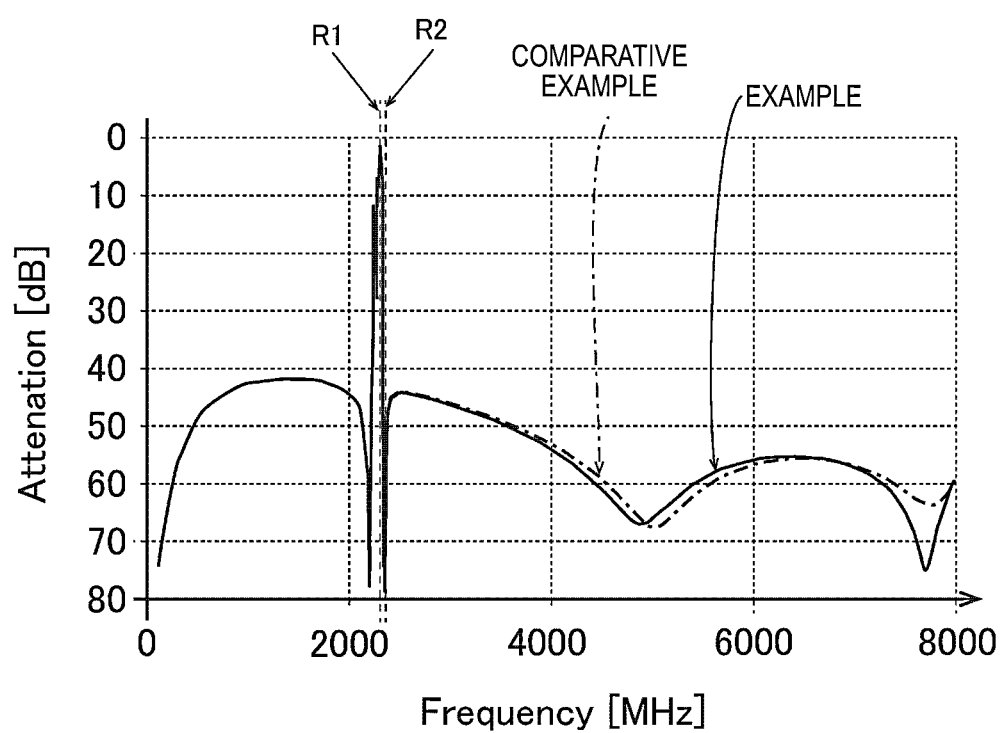
FIG. 9 is a diagram illustrating attenuation characteristics of a transmission filter 10 according to an example of a preferred embodiment of the present invention and attenuation characteristics of the transmission filter according to a comparative example.

FIG. 9 is a diagram illustrating the attenuation characteristics of the transmission filter 10 according to the present preferred embodiment and the attenuation characteristics of the transmission filter according to the comparative example. As illustrated in FIG. 9, the attenuation characteristics of the transmission filter 10 according to the present preferred embodiment and the attenuation characteristics of the transmission filter according to the comparative example were obtained by simulation. As illustrated in FIG. 9, in the frequency band higher than the pass band R2, the pole positions of the attenuation characteristics of the transmission filter 10 according to the present preferred embodiment shifted to the lower frequency side with respect to the pole positions of the attenuation characteristics of the transmission filter according to the comparative example. There was no band where the attenuation of the transmission filter 10 according to the present preferred embodiment was much lower than the attenuation of the transmission filter according to the comparative example, indicating that the attenuation characteristics of the transmission filter 10 according to the present preferred embodiment did not deteriorate with respect to the attenuation characteristics of the transmission filter according to the comparative example.

Figure 10:
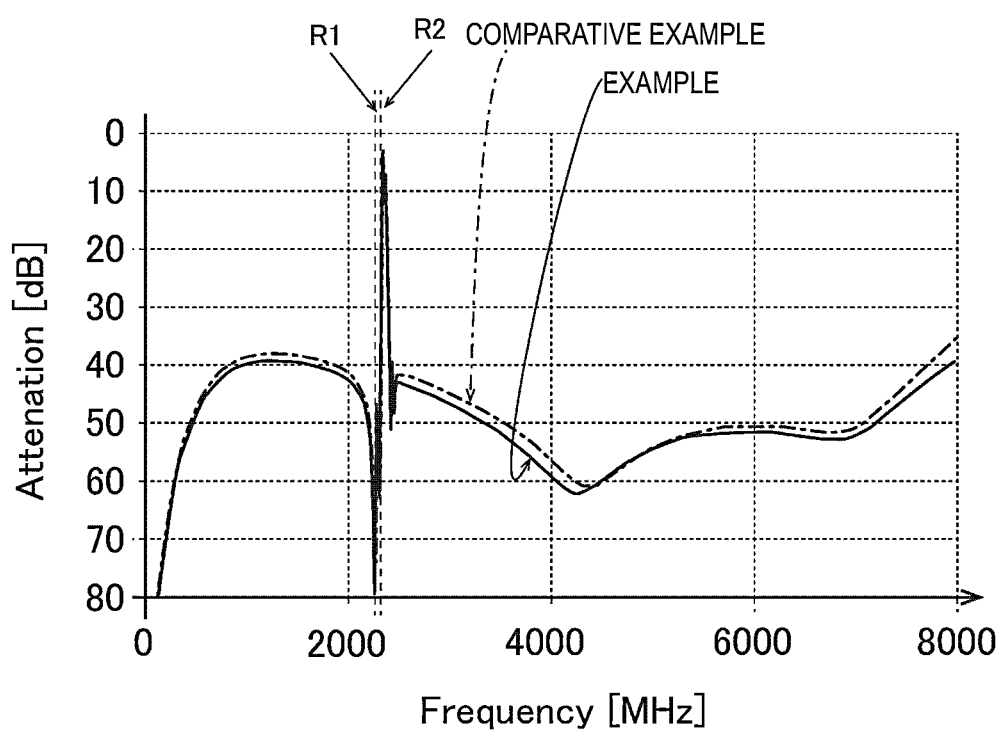
FIG. 10 is a diagram illustrating attenuation characteristics of a reception filter 20 according to an example of a preferred embodiment of the present invention and attenuation characteristics of the reception filter according to a comparative example.

FIG. 10 is a diagram illustrating the attenuation characteristics of the reception filter 20 according to the present preferred embodiment and the attenuation characteristics of the reception filter according to the comparative example. As illustrated in FIG. 10, the attenuation characteristics of the reception filter 20 according to the present preferred embodiment and the attenuation characteristics of the reception filter according to the comparative example were obtained by simulation. As illustrated in FIG. 10, the attenuation of the reception filter 20 according to the present preferred embodiment was larger than the attenuation of the transmission filter according to the comparative example in bands other than the pass bands R1 and R2. Therefore, the attenuation characteristics of the reception filter 20 according to this example were found to have improved with respect to the attenuation characteristics of the reception filter of the comparative example.

Figure 11:
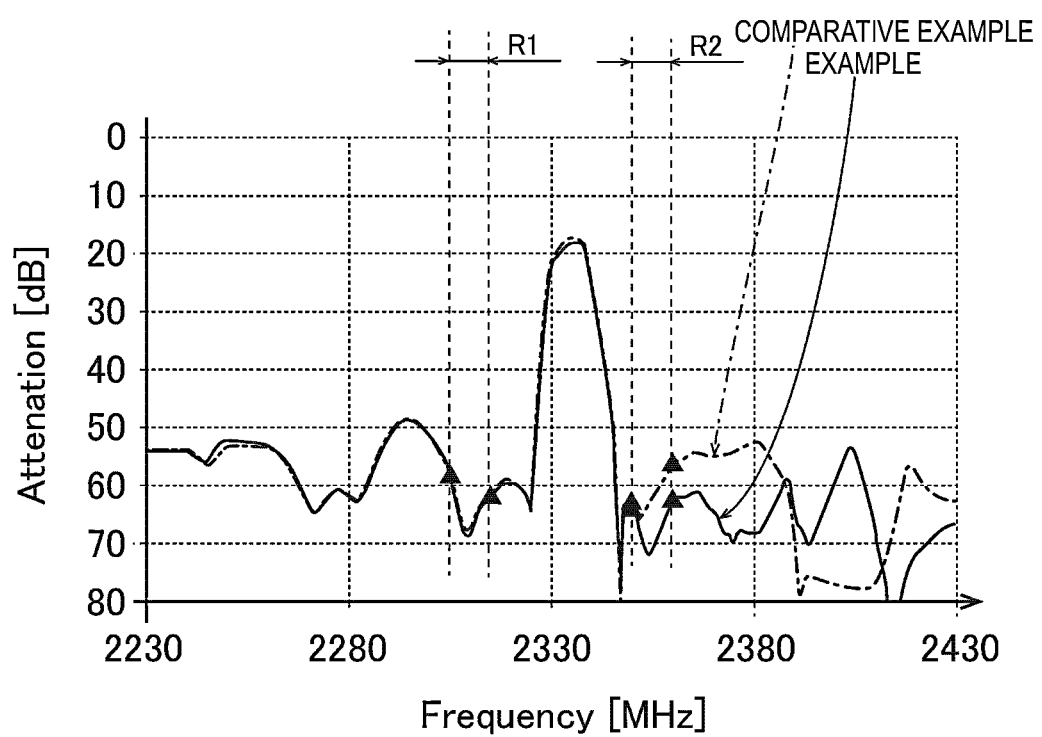
FIG. 11 is a diagram illustrating isolation characteristics of a composite filter device 100 according to an example of a preferred embodiment of the present invention and isolation characteristics of a composite filter device according to a comparative example.

FIG. 11 is a diagram illustrating the isolation characteristics of the composite filter device 100 according to the present preferred embodiment and the isolation characteristics of the composite filter device according to the comparative example. As illustrated in FIG. 11, the isolation characteristics of the composite filter device 100 according to the present preferred embodiment and the isolation characteristics of the composite filter device according to the comparative example were obtained by simulation. As illustrated in FIG. 11, in the pass band R1, the attenuation of the composite filter device 100 according to the present preferred embodiment did not become smaller than the attenuation of the composite filter device according to the comparative example. Therefore, in the pass band R1, the isolation characteristics of the composite filter device 100 according to the present preferred embodiment did not deteriorate with respect to the isolation characteristics of the composite filter device according to the comparative example. In the pass band R2, the attenuation of the composite filter device 100 according to the present preferred embodiment was larger than the attenuation of the composite filter device according to the comparative example. Therefore, in the pass band R2, the isolation characteristics of the composite filter device 100 according to the present preferred embodiment were found to have improved with respect to the isolation characteristics of the composite filter device according to the comparative example.

The above results show that the composite filter device 100 according to the present preferred embodiment can improve the attenuation characteristics and isolation characteristics of the reception filter 20, while preventing the bandpass characteristics of the transmission filter 10 and the reception filter 20 from deteriorating, compared to the composite filter according to the comparative example.

MODIFICATION OF PRESENT PREFERRED EMBODIMENT

First Modification

Figure 12:
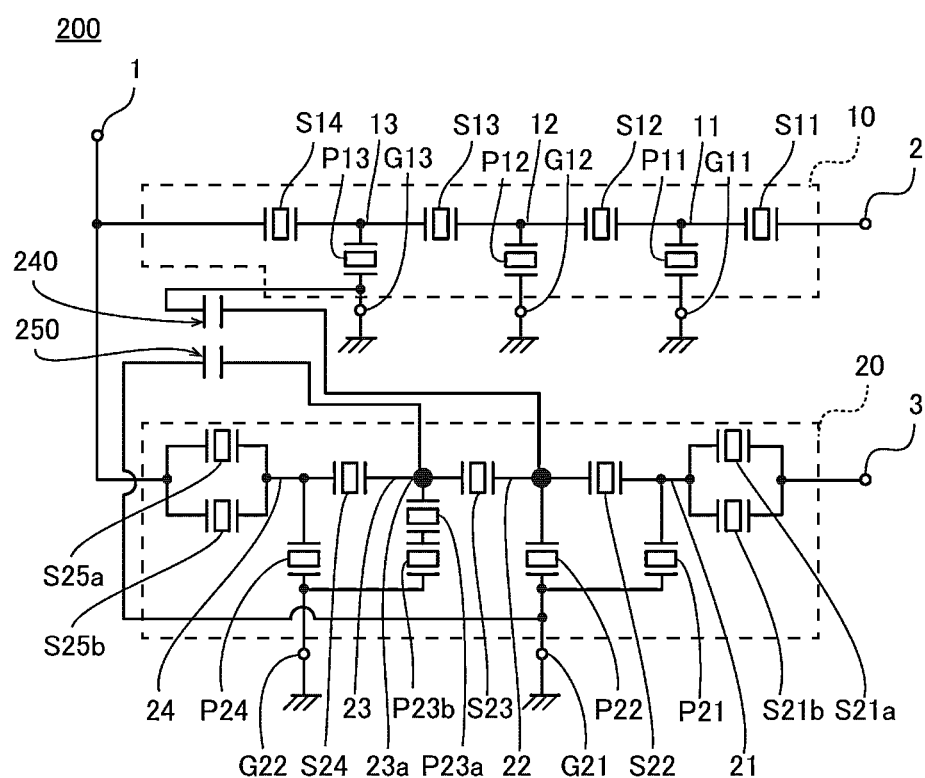
FIG. 12 is a diagram illustrating a configuration of a composite filter device 200 according to a first modification of a preferred embodiment of the present invention.

In the above-described preferred embodiment, a non-limiting example has been described in which the first capacitance element 40 and the second capacitance element 50 are connected to the common signal line 23 (node 23a), but the present disclosure is not limited thereto. For example, as illustrated in FIG. 12, in a composite filter device 200 according to a first modification of a preferred embodiment of the present invention, a first capacitance element 240 may be connected to the signal line 22, and a second capacitance element 250 may be connected to the signal line 23. Even in this configuration, with the first capacitance element 240, a closed circuit including the first capacitance element 240, resonators on the antenna side in the transmission filter 10, and resonators on the antenna side in the reception filter 20 is formed, as illustrated in FIG. 12. As a result, the pole positions of the pass band R2 (the pass band of the reception filter 20) in the transmission filter 10 can be changed, thereby changing the attenuation characteristics. Further, the second capacitance element 250 is connected to a line between the signal line 23 (HOT line) of the reception filter 20 and the reference potential electrode G21a, thereby forming a closed circuit including the second capacitance element 250, the series arm resonator S23, and the parallel arm resonator P22, and a closed circuit including the second capacitance element 250, the series arm resonators S23 and S22, and the parallel arm resonator P21. As a result, the capacitance values of some of these resonators can be changed, thereby changing the attenuation characteristics of the reception filter 20 in bands other than the pass band. Further, since both the first capacitance element 240 and the second capacitance element 250 are connected to the HOT line (the signal line 22 or 23) of the reception filter 20, the impedances of the transmission filter 10 and the reception filter 20 can be easily adjusted. As a result, it is possible to improve, while preventing the bandpass characteristics from deteriorating, the attenuation characteristics in a counterpart band of the transmission filter 10, the attenuation characteristics in bands other than the pass band of the reception filter 20, and the isolation characteristics in the pass band of the reception filter 20.

Second Modification

Figure 13A:
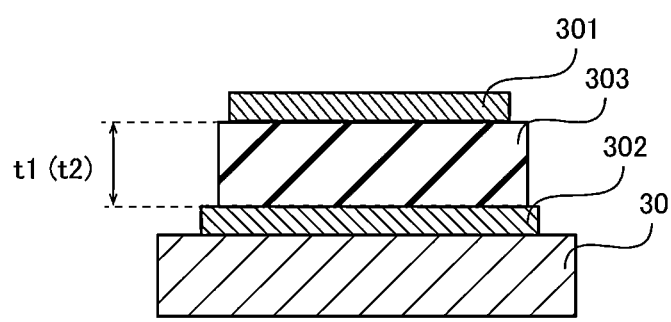
FIG. 13A is a sectional view illustrating a configuration of a first capacitance element 340 according to a second modification of a preferred embodiment of the present invention.
Figure 13B:
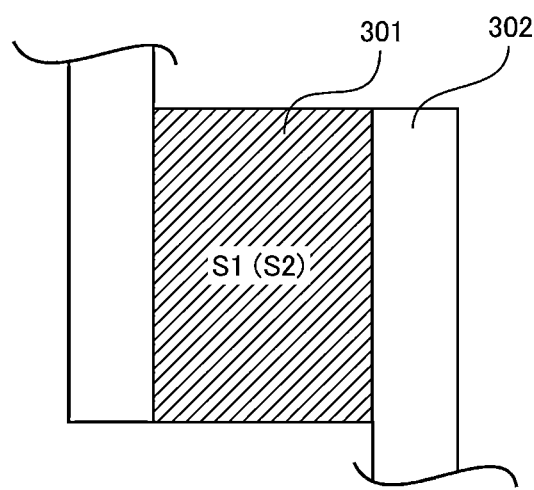
FIG. 13B is a plan view illustrating the configuration of the first capacitance element 340 according to the second modification of the preferred embodiment of the present invention.

In the above-described preferred embodiment, a non-limiting example has been described in which both the first capacitance element 40 and the second capacitance element 50 include the IDT electrodes, but the present disclosure is not limited thereto. For example, as illustrated in FIGS. 13A and 13B, the composite filter device according to a second modification of a preferred embodiment of the present invention is provided with the first capacitance element 340 including the dielectric 303. The first capacitance element 340 is formed on, for example, the piezoelectric substrate 30. As illustrated in FIG. 13A, the first capacitance element 340 includes electrodes 301 and 302, and a dielectric 303 disposed between the electrodes 301 and 302. Thus, an electrical capacitance is generated between the electrodes 301 and 302. Note that the composite filter device according to the second modification may be provided with a second capacitance element 350 including the electrodes 301 and 302 and the dielectric 303 disposed between the electrodes 301 and 302. In this case, a capacitance of the first capacitance element 340 is determined by an inter-electrode distance t1 (a width of the dielectric 303) and an area S1 in which the electrodes 301 and 302 overlap with each other in plan view, as illustrated in FIG. 13B. Note that, in FIG. 13B, an area in which the electrodes 301 and 302 overlap with each other is illustrated by hatching. Further, a capacitance of the second capacitance element 350 is determined by an inter-electrode distance t2 (a width of the dielectric 303) and an area S2 in which the electrodes 301 and 302 overlap with each other in plan view. Note that, in FIG. 13A, the inter-electrode distances t1 and t2 are described equally, and in FIG. 13B, the areas S1 and S2 are described equally, but the present disclosure is not limited thereto. As in the first preferred embodiment, the inter-electrode distance t1 may be smaller than the inter-electrode distance t2, or the area S1 may be larger than the area S2 so that the electrical capacitance of the first capacitance element 340 is larger than the electrical capacitance of the second capacitance element 350. Alternatively, the inter-electrode distance t1 may be larger than the inter-electrode distance t2 or the area S1 may be smaller than the area S2 so that the electrical capacitance of the first capacitance element 340 is smaller than the electrical capacitance of the second capacitance element 350.

Third Modification

Figure 14:
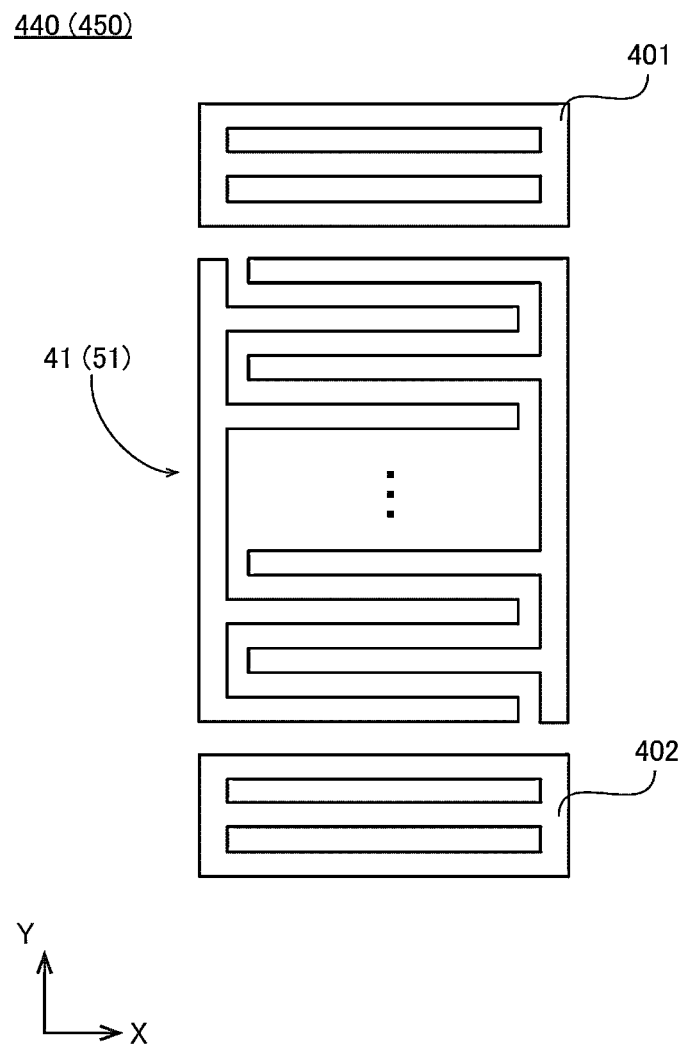
FIG. 14 is a diagram illustrating a configuration of a first capacitance element 440 according to a third modification of a preferred embodiment of the present invention.

In the above-described preferred embodiment, a non-limiting example has been described in which the first capacitance element 40 and the second capacitance element 50 are provided without including reflectors, but the present disclosure is not limited thereto. For example, as illustrated in FIG. 14, a composite filter device according to a third modification of a preferred embodiment of the present invention includes a first capacitance element 440 in which reflectors 401 and 402 are arranged on both sides of the IDT electrode 41. Note that the composite filter device according to the third modification may include a second capacitance element 450 including the reflectors 401 and 402.

Fourth Modification

Figure 15:
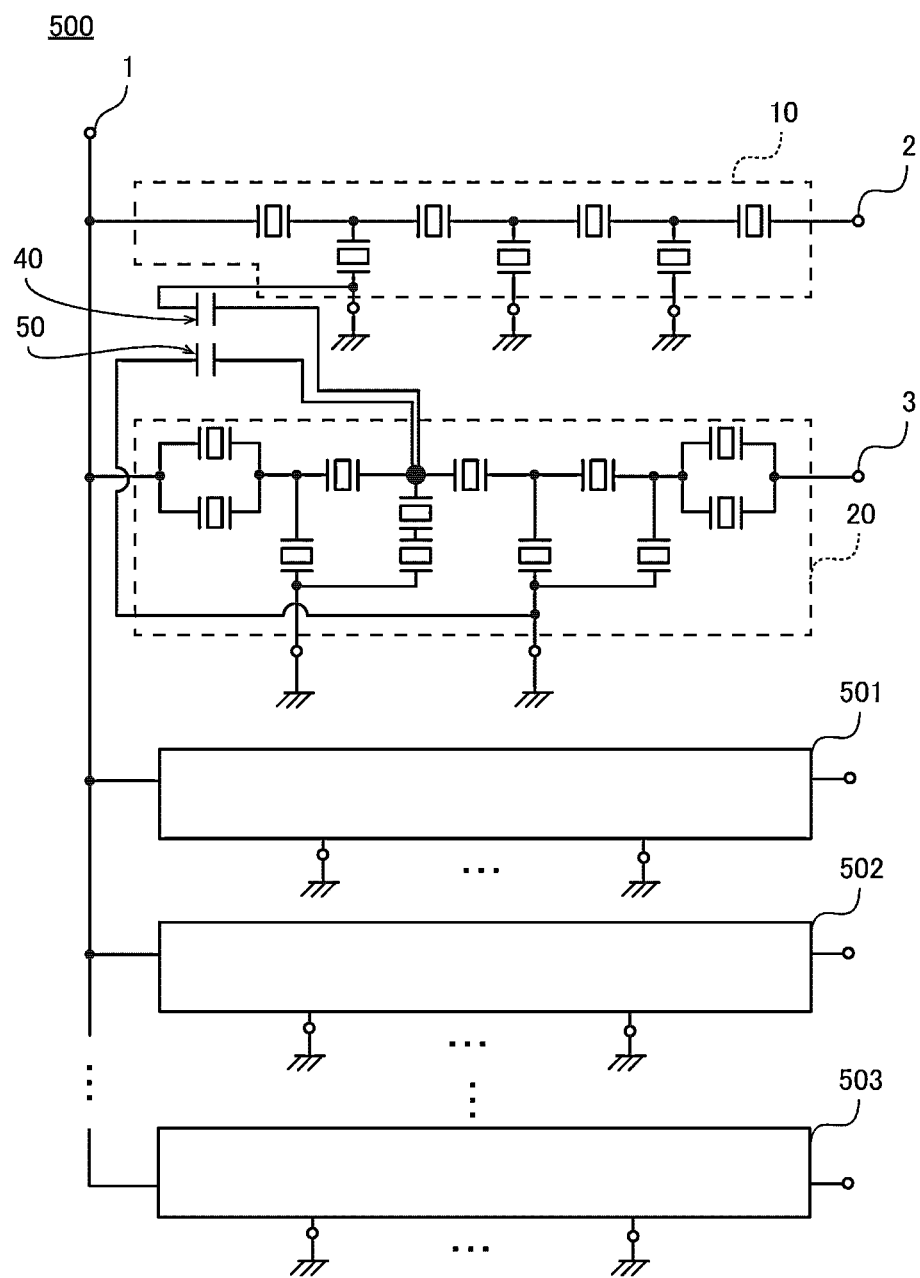
FIG. 15 is a diagram illustrating a configuration of a composite filter device 500 according to a fourth modification of a preferred embodiment of the present invention.

In the above-described preferred embodiment, a non-limiting example has been described in which the composite filter device 100 is configured as a duplexer, but the present disclosure is not limited thereto. For example, as illustrated in FIG. 15, a composite filter device 500 according to a fourth modification of a preferred embodiment of the present invention includes the transmission filter 10, the reception filter 20, and one or more filters 501 to 503. In other words, the composite filter device 500 may be configured as a multiplexer.

Other Modifications

Preferred embodiments and modifications thereof have been described above, the above-described preferred embodiments and modifications are merely examples for implementing the present disclosure. Therefore, the present disclosure is not limited to the above-described preferred embodiments and modifications, but the above-described preferred embodiments and modifications can be appropriately modified and implemented without departing from the spirit of the present disclosure.

(1) In the above-described preferred embodiments, a non-limiting example has been described in which the composite filter device is provided with the transmission filter and the reception filter, but the present disclosure is not limited thereto. For example, the composite filter device may include only a plurality of transmission filters having mutually different pass bands, or the composite filter device may include only a plurality of reception filters having mutually different pass bands.

(2) In the above-described preferred embodiments, a non-limiting example has been described in which the reference potential is set to the ground potential, but the present disclosure is not limited thereto. For example, the reference potential may be set to a predetermined constant potential different from the ground potential.

(3) In the above-described preferred embodiments, a non-limiting example has been described in which the composite filter device is used for mobile communications used in frequency bands defined in the 3GPP standard, but the present disclosure is not limited thereto. In other words, the composite filter device may be used in other frequency bands according to the 3GPP standard. For example, the composite filter device may be used in frequency bands for television broadcasting.

(4) In the above-described preferred embodiments, a non-limiting example has been described in which a direction in which the electrode fingers of the first capacitance element and the second capacitance element extend is orthogonal to a direction in which the electrode fingers of the resonator extend, but the present disclosure is not limited thereto. The direction in which the electrode fingers of the first capacitance element and the second capacitance element extend may intersect the direction in which the electrode fingers of the resonator extend at an angle that is greater than 0 degrees and less than 90 degrees. Alternatively, the direction in which the electrode fingers of the first capacitance element and the second capacitance element extend may be the same as the direction in which the electrode fingers of the resonator extend.

(5) In the above-described preferred embodiments, a non-limiting example has been described in which the first capacitance element and the second capacitance element are arranged adjacent to each other on the piezoelectric substrate, but the present disclosure is not limited thereto. For example, the resonator may be disposed between the first capacitance element and the second capacitance element.

(6) In the above-described preferred embodiments, a non-limiting example has been described in which the electrical capacitance of the first capacitance element is larger than the electrical capacitance of the second capacitance element, but the present disclosure is not limited thereto. In other words, the electrical capacitance of the first capacitance element may be equal to or less than the electrical capacitance of the second capacitance element.

The above-described composite filter devices can also be described as follows.

A composite filter device according to a first configuration includes a piezoelectric substrate including a first reference potential electrode and a second reference potential electrode, a first acoustic wave filter having a first pass band, a second acoustic wave filter having a second pass band higher than the first pass band, a first capacitance element including a first end connected to the first reference potential electrode, and a second capacitance element including a first end connected to the second reference potential electrode, wherein the first acoustic wave filter includes a first parallel arm resonator on the piezoelectric substrate and connected to the first reference potential electrode, the second acoustic wave filter includes a second parallel arm resonator on the piezoelectric substrate and connected to the second reference potential electrode, and a plurality of series arm resonators, a second end of the first capacitance element is connected to a signal line connecting the plurality of series arm resonators, and a second end of the second capacitance element is connected to the signal line connecting the plurality of series arm resonators (first configuration).

According to the first configuration described above, the capacitance value of a portion of the first acoustic wave filter can be changed by the first capacitance element to locally change attenuation characteristics of the first acoustic wave filter in frequency bands higher than the first pass band. Further, attenuation characteristics of the second acoustic wave filter can be locally changed because a capacitance is added in parallel to a portion of the second acoustic wave filter by the second capacitance element. Additionally, connecting both the first capacitance element and the second capacitance element to a signal line, which connects a plurality of series arm resonators in the second acoustic wave filter, can extend a band in which the attenuation characteristics can be adjusted. Further, connecting the first capacitance element to the second capacitance element can adjust impedance characteristics of the first acoustic wave filter and impedance characteristics of the second acoustic wave filter. As a result, adjusting the impedance characteristics of one of the first acoustic wave filter and the second acoustic wave filter can be prevented from affecting bandpass characteristics of the other thereof. Consequently, it is possible to improve, while preventing bandpass characteristics from deteriorating, attenuation characteristics and isolation characteristics.

In the first configuration, the plurality of series arm resonators may include a first series arm resonator and a second series arm resonator directly connected to the first series arm resonator. The second end of the first capacitance element and the second end of the second capacitance element may be connected to a line between the first series arm resonator and the second series arm resonator (second configuration).

In the second configuration, the first capacitance element and the second capacitance element may be disposed between the first parallel arm resonator and one of the first series arm resonator and the second series arm resonator in plan view (third configuration).

In any one of the first to third configurations, at least one of the first acoustic wave filter and the second acoustic wave filter may include a first IDT electrode. At least one of the first capacitance element and the second capacitance element may include a second IDT electrode (fourth configuration).

In the fourth configuration, a direction in which electrode fingers of the second IDT electrode extend may intersect a direction in which comb teeth of the first IDT electrode extend (fifth configuration).

In any one of the first to fifth configurations, the first capacitance element and the second capacitance element may be arranged adjacent to each other in plan view (sixth configuration).

In the sixth configuration, the second capacitance element and the second reference potential electrode may be arranged adjacent to each other in plan view (seventh configuration).

In any one of the first to seventh configurations, an electrical capacitance of the first capacitance element may be larger than an electrical capacitance of the second capacitance element (eighth configuration).

In any one of the first to eighth configurations, the first acoustic wave filter may be a transmission filter. The second acoustic wave filter may be a reception filter (ninth configuration).

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A composite filter device comprising:
   a piezoelectric substrate including a first reference potential electrode and a second reference potential electrode;
   a first acoustic wave filter having a first pass band;
   a second acoustic wave filter having a second pass band higher than the first pass band;
   a first capacitance element including a first end connected to the first reference potential electrode; and
   a second capacitance element including a first end connected to the second reference potential electrode; wherein
   the first acoustic wave filter includes a first parallel arm resonator on the piezoelectric substrate and connected to the first reference potential electrode;
   the second acoustic wave filter includes a second parallel arm resonator on the piezoelectric substrate and connected to the second reference potential electrode, and a plurality of series arm resonators;
   a second end of the first capacitance element is connected to a signal line connecting the plurality of series arm resonators; and
   a second end of the second capacitance element is connected to the signal line connecting the plurality of series arm resonators.

2. The composite filter device according to claim 1, wherein
   the first acoustic wave filter is a transmission filter; and
   the second acoustic wave filter is a reception filter.

3. The composite filter device according to claim 2, further comprising:
   an antenna terminal;
   a transmission terminal; and
   a reception terminal; wherein
   the transmission filter is between the antenna terminal and the transmission terminal;
   the reception filter is between the antenna terminal and the reception terminal.

4. The composite filter device according to claim 3, wherein the series arm resonators are connected to each other in series between the transmission terminal and the antenna terminal.

5. The composite filter device according to claim 2, wherein each of the transmission filter and the reception filter includes a ladder circuit structure.

6. The composite filter device according to claim 2, wherein the transmission filter includes a ladder unbalanced circuit.

7. The composite filter device according to claim 2, wherein the reception filter includes a ladder unbalanced circuit.

8. The composite filter device according to claim 1, wherein
   at least one of the first acoustic wave filter and the second acoustic wave filter includes a first IDT electrode; and
   at least one of the first capacitance element and the second capacitance element includes a second IDT electrode.

9. The composite filter device according to claim 8, wherein a direction in which electrode fingers of the second IDT electrode extend intersects a direction in which electrode fingers of the first IDT electrode extend.

10. The composite filter device according to claim 8, wherein reflectors are provided at opposite ends of the first IDT electrode.

11. The composite filter device according to claim 1, wherein
    the plurality of series arm resonators include a first series arm resonator and a second series arm resonator directly connected to the first series arm resonator; and
    the second end of the first capacitance element and the second end of the second capacitance element are connected to a line between the first series arm resonator and the second series arm resonator.

12. The composite filter device according to claim 11, wherein the first capacitance element and the second capacitance element are between the first parallel arm resonator and one of the first series arm resonator and the second series arm resonator in plan view.

13. The composite filter device according to claim 1, wherein the first capacitance element and the second capacitance element are adjacent to each other in plan view.

14. The composite filter device according to claim 13, wherein the second capacitance element and the second reference potential electrode are adjacent to each other in plan view.

15. The composite filter device according to claim 1, wherein each of the first parallel arm resonator, the second parallel arm resonator, and the plurality of series arm resonators include a plurality of surface acoustic wave resonators.

16. The composite filter device according to claim 15, wherein the plurality of surface acoustic wave resonators have different configurations.

17. The composite filter device according to claim 1, wherein an electrical capacitance of the first capacitance element is larger than an electrical capacitance of the second capacitance element.

18. The composite filter device according to claim 1, wherein the composite filter device is a duplexer.

19. The composite filter device according to claim 1, wherein the composite filter device is structured to perform communication in a band from about 700 MHz to about 6 GHz.

20. The composite filter device according to claim 1, wherein the composite filter device is structured to perform communication in a band defined by the Third Generation Partnership Project.

* * * * *